United States Patent

Kanematsu et al.

[11] Patent Number: 5,980,086
[45] Date of Patent: Nov. 9, 1999

[54] FACILITY OPERATING METHOD

[75] Inventors: Kouichi Kanematsu, Hirakata; Kenichi Sato, Ikoma, both of Japan

[73] Assignee: Matsushita Electric Industrial Co., Ltd., Osaka, Japan

[21] Appl. No.: 09/000,234

[22] PCT Filed: Jun. 6, 1997

[86] PCT No.: PCT/JP97/01970

§ 371 Date: Apr. 13, 1998

§ 102(e) Date: Apr. 13, 1998

[87] PCT Pub. No.: WO97/47170

PCT Pub. Date: Dec. 11, 1997

[30] Foreign Application Priority Data

Jun. 6, 1996 [JP] Japan ................................. 8-143901

[51] Int. Cl.$^6$ .............................. G06F 19/00; G06G 7/66
[52] U.S. Cl. .............................. 364/468.07; 364/468.06; 364/468.15; 364/468.05; 29/564.1; 29/740; 29/832
[58] Field of Search ................. 364/468.07, 468.06, 364/468.05, 468.15; 29/832, 564.1, 740

[56] References Cited

U.S. PATENT DOCUMENTS

| | | | |
|---|---|---|---|
| 4,794,689 | 1/1989 | Seno et al. | 29/740 |
| 5,003,692 | 4/1991 | Izumi et al. | 29/843 |
| 5,186,303 | 2/1993 | Seto et al. | 198/345.1 |
| 5,189,707 | 2/1993 | Suzuki et al. | 382/8 |
| 5,317,802 | 6/1994 | Jyoko | 29/832 |
| 5,402,564 | 4/1995 | Tsukasaki et al. | 29/832 |
| 5,862,586 | 1/1999 | Kimura | 29/832 |
| 5,876,556 | 3/1999 | Takanami | 156/556 |

FOREIGN PATENT DOCUMENTS

| | | |
|---|---|---|
| 4-257968 | 9/1992 | Japan . |
| 5-138467 | 6/1993 | Japan . |
| 6-196899 | 7/1994 | Japan . |
| 8-18299 | 1/1996 | Japan . |

*Primary Examiner*—Paul P. Gordon
*Assistant Examiner*—Ramesh Patel
*Attorney, Agent, or Firm*—McDermott, Will & Emery

[57] ABSTRACT

Through selecting machines from groups of equipment, determine a line composition for producing a specific product so that a tact time of the line may not exceed an initial set tact time. Give a priority order to the machines based on machines' features, thereby grouping the machines. Store information including the priority order within each group, the priority order between the groups, mounting tact time of the loadable parts, and the tact times proper to each machine into an external storage 1 as control information 2. Supplement the machines according to the priority order to the line composition from the equipment until all the parts are loaded, and calculate the tact time of the line with a CPU 3. Supplement the machines successively from the groups of equipment until the line tact time becomes not more than the initial set tact time. The line tact time is calculated with the CPU 3.

2 Claims, 7 Drawing Sheets

FACILITY OPERATING METHOD

FIELD OF THE INVENTION

The present invention relates to an operation method of equipment, through which an appropriate composition of an assembling line is found from plural groups of mounting equipment which mount electronic parts onto a PCB (printed circuit board), and more particularly by selecting machines for manufacturing a specific PCB (printed circuit board) so that a tact time (tact time: maximum work time necessary for a process) of the assembly line may not exceed the initial set tact time.

BACKGROUND OF THE INVENTION

In a mounting process of electronic parts, an assembly line has been composed by utilizing individual feature of each mounting machine, and thereby manufacturing a PCB. For example, in a mounting process of micro-chip parts, a high-speed surface mounting machine mounts the parts, and when mounting QFP (quad flat package) and others having so narrow spacing between pathways of leads or pins that a precise mounting is required a robot type machine featuring precise mounting is employed after the process using the high-speed machine. Such an operation of combining different types of machines improves a quality of an efficiency of the entire assembly line. It is also a well-known operation method that a plurality of the same machines is placed in one assembly line in order to shorten a tact time of the assembly line. When determining compositions of these conventional assembly lines, a line manager has to do the following jobs manually.

1. Collect such data from the parts list for the specific PCB as numbers of parts, available machines for mounting the parts, individual tact time for mounting each part of each machine, maximum loadable numbers of parts into each machine.

2. Determine whether plural assembly lines are necessary for manufacturing this type of PCB, e.g. determine whether independent lines are necessary for insertion process, surface mounting process, and semiconductor mounting process. Then, assign each part to a line, and the following policy must be considered when a line composition is determined.

2-1. In general, assign a maximum loadable parts into a machine of the highest mounting speed among the group of machines. Surplus parts from the machine, or non-loadable parts into the machine are assigned to another machine of next higher mounting speed. The same procedure follows until all parts are assigned.

2-2. Reassign the parts within each line in order to smooth out the load to each machine so that a specific machine may not take an exceptionally longer tact time. For this purpose, an optimizing simulation using a computer are already available as a prior art.

2-3. After smoothing out, if the tact time of each line satisfies the desirable level, this line composition is finalized as an actual mounting line. If the tact time of each line could not satisfy the desirable level, a next possible machine is supplemented to the line composition so that the total tact time of the line may satisfy the desirable level. This procedure follows until the total tact time of the lines satisfies the desirable level.

The above procedure, however, leaves several problems to factory staff;

(1) This kind of manual procedure requires a great deal of time and labor for finalizing a desirable line composition, in particular, when planning an annual business plan, a common line composition must be finalized for plural types of PCBs. In this case, try & error calculations are repeated until every tact time of lines for each type of PCBs becomes not more than a desirable time. When any PCBs encounter some changes in a trial production, or due to specific changes, the same kind of calculation must be repeated.

(2) When a factory is equipped with sizable equipment, it is not an optimal operation for the entire factory if there is dispersion between each tact time of lines after finalizing the line compositions for plural types of PCBs. In this case, a line composition of each type of PCBs could not be finalized manually because calculations should be in too many numbers of combinations between sizable equipment and plural types of PCBs.

(3) Only specific line managers who know in detail about mounting conditions of equipment, e.g. each tact time of all equipment, can manage the above procedures and calculations, and ordinary workers cannot follow the procedure nor manage the calculations.

SUMMARY OF THE INVENTION

In plural groups of equipment which mount parts onto an object to be processed, the present invention provides an operation method of equipment which determines a line composition by selecting appropriate machines from groups of equipment for processing designated products so that a tact time of an assembly line may not exceed the initial set tact time. The operation comprises the following three processes:

Process 1. Group the machines into plural groups based on a priority order of assigning parts to each machine considering the machines' features from the groups of equipment, and then store such information into an external storage as the priority orders within each group, a priority order between the groups, a mounting tact time of each loadable part to a machine, and a tact time to each machine.

Process 2. Calculate a tact time of each assembly line using the control information after determining a line composition through selecting machines from the groups of equipment based on the priority order until all necessary parts for processing the product are loaded to the machines.

Process 3. Supplement machines to the line composition determined in Process 2 through machine selection from the groups of equipment based on the priority order until the tact time of the assembly line becomes not more than the initial set level, and calculate the tact time of the assembly line.

According to the present invention, a line composition of which tact time is not more than an initial set tact time can be automatically determined through selecting necessary machines from the equipment for processing a designated product.

EXEMPLARY EMBODIMENTS OF THE INVENTION

The invention disclosed in claim 1 provides an equipment operation method which has plural groups of equipment for mounting parts onto an object to be processed, and which determines a line composition by selecting appropriate machines from the groups of equipment for processing designated products so that a tact time of an assembly line may not exceed an initial set tact time. The operation comprises the following three processes:

Process 1. Group machines into the plural groups based on a priority order of assigning each part to a machine considering the machines' features, and then to store such information into an external storage as the priority orders between machines within each group, a priority order between the groups, a mounting tact time of each loadable part to a machine, and a tact time proper to each machine.

Process 2. Calculate a tact time of each assembly line using the stored information after supplementing machines based on the priority order from the groups of equipment in the line composition until all necessary parts for processing the product are loaded to the machines.

Process 3. Calculate the tact time of the line composition by supplimenting machines based on the priority order from the groups of equipment to the line composition determined in Process 2 until the tact time of the assembly line becomes not more than the initial set tact time.

When manufacturing a specific object to be processed by using the plural groups of equipment, the invention disclosed in claim 1, thus, can automatically determine a line composition of which tact time is not more than an initial set time by selecting necessary machines from the groups of equipment.

The invention disclosed in claim 2 provides an equipment operation method which determines a line composition, in plural groups of mounting equipment which mount electronic parts onto PCBs, by selecting appropriate mounting machines from the groups of mounting equipment for mounting electronic parts to designated PCBs so that a tact time of an assembly line may not exceed an initial set tact time. The operation comprises the following three processes:

Process 1. Group the machines into plural groups based on a priority order of assigning each electronic part to a machine considering the machines' features from the groups of mounting equipment, and then store such information into an external storage as the priority orders between machines within each group, a priority order between the groups, a mounting tact time of each loadable electronic part to a mounting machine, and a tact time proper to each mounting machine.

Process 2. Calculate a tact time of each assembly line using the stored data after supplementing machines based on the priority order from the groups of equipment in the line composition until all necessary electronic parts to be mounted on to the designated PCBs are loaded to the mounting machines.

Process 3. Calculate the tact time of the line composition by supplimenting machines based on the priority order from the groups of mounting equipment to the line composition determined in Process 2 until the tact time of the assembly line becomes not more than the initial set tact time.

When manufacturing a specific PCB by using plural groups of mounting equipment, the invention disclosed in claim 2, thus, can automatically determine a line composition of which tact time is not more than an initial set time by selecting necessary mounting machines from the groups of mounting equipment.

An exemplary embodiment of the present invention is described here by referring to the drawings. The equipment operation method cited in this embodiment is applicable to the mounting process of electronic parts.

Figure 1:
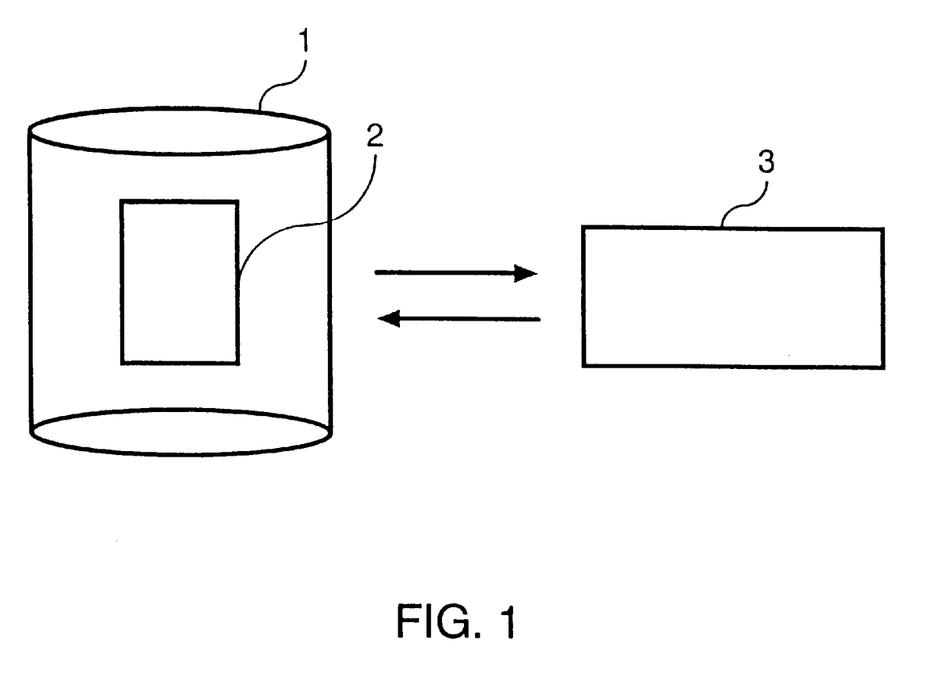
FIG. 1 is a hardware partial view used in the operation method of equipment of the present invention.

FIG. 1 shows hardware partial view used in the equipment operation method of the present invention, where a CPU 3 (Central Processing Unit) executes input/output about control information 2 stored in an external storage 1. The external storage 1 may be composed of a relational data base system or a file system which is known as a public domain.

An equipment operation method of the present invention comprises Process 1, Process 2 and Process 3 detailed below:

Process 1

Figure 2:
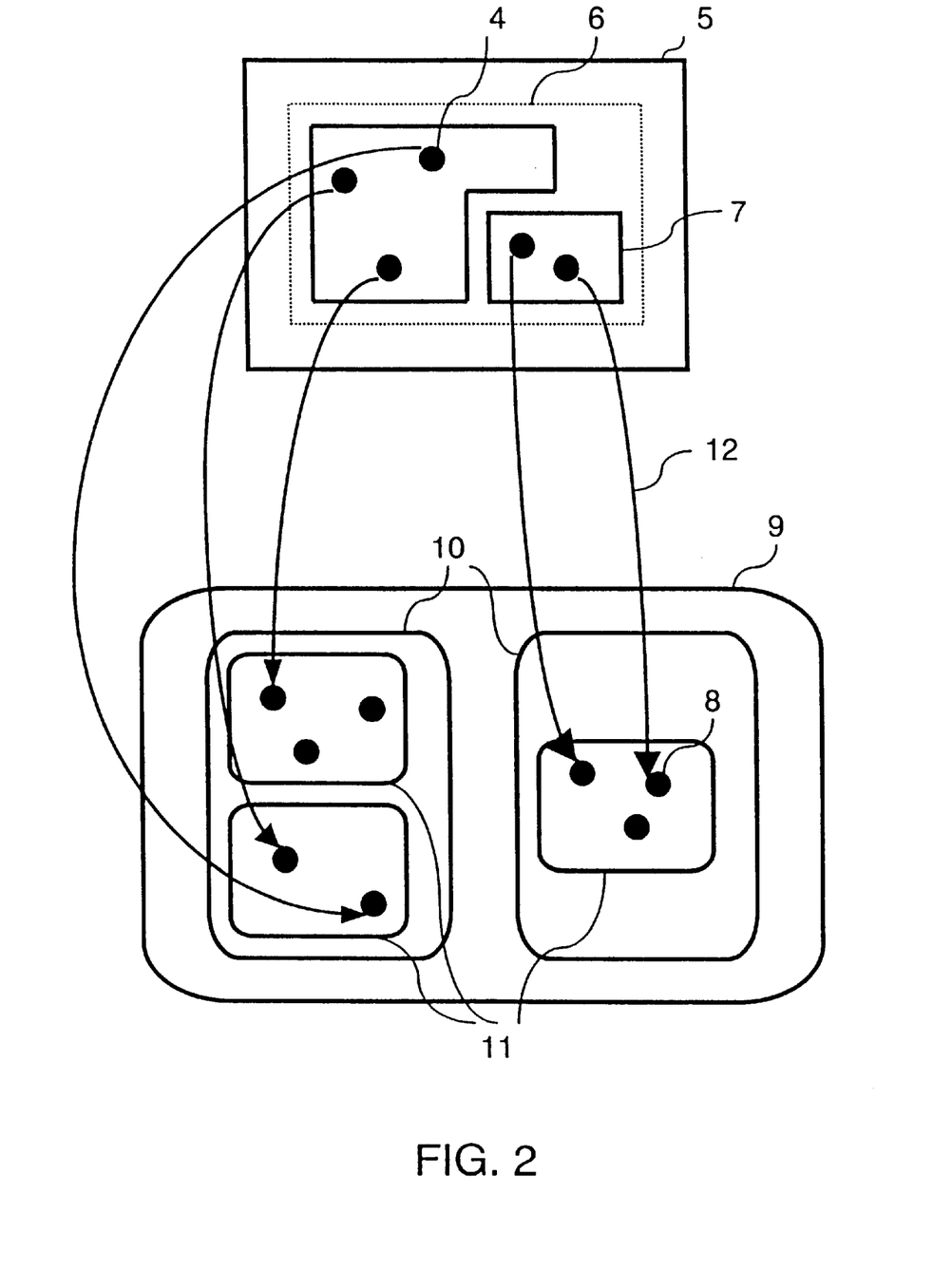
FIG. 2 depicts a structuring method of control information used in an embodiment of the present invention.

A method structuring control information, is explained based on FIG. 2. Electronic parts 4 are mounted on a PCB 5 by various types of mounting machines 8. Parts are assigned to available machines (Part Assignment 12), which can mount or which should prioritize based on machines features, in accordance with shapes and characteristics of parts. An assignment table 6 contains information about parts to be mounted on a PCB. A partial-assignment-table 7 is a subset of the assignment table 6. The plural groups of equipment are grouped based on equipment's features and a line composition is determined in Process 2 and onward.

Process 2

Groups of mounting equipment 9 are grouped into an equipment GROUP 10, an equipment TYPE 11 (each machine is included in the equipment group 10), and a mounting machine 8 (each mounting machine is included in the equipment type 11.)

When there are different conditions of mounting methods, the equipment GROUP is used to compose a line based on a same mounting method. There may be several equipment GROUPS such a surface mounting group, insertion machine group, and semi-conductor mounting group. The priority order of part assignment is applied between the groups.

The equipment TYPE is used when there are different features within a same equipment GROUP. There may be several types such as high-speed mounting machine, and multifunctional mounting machine. The priority order of part assignment is applied between the types and also between each machine.

the structure of control information 2 including the grouping mentioned above is detailed by referring to FIG. 3. The control information 2 is grouped depending on relevant information, and the control information 2 is managed every table. Each table can refer to others by using a relevant item as a key.

Figure 3:
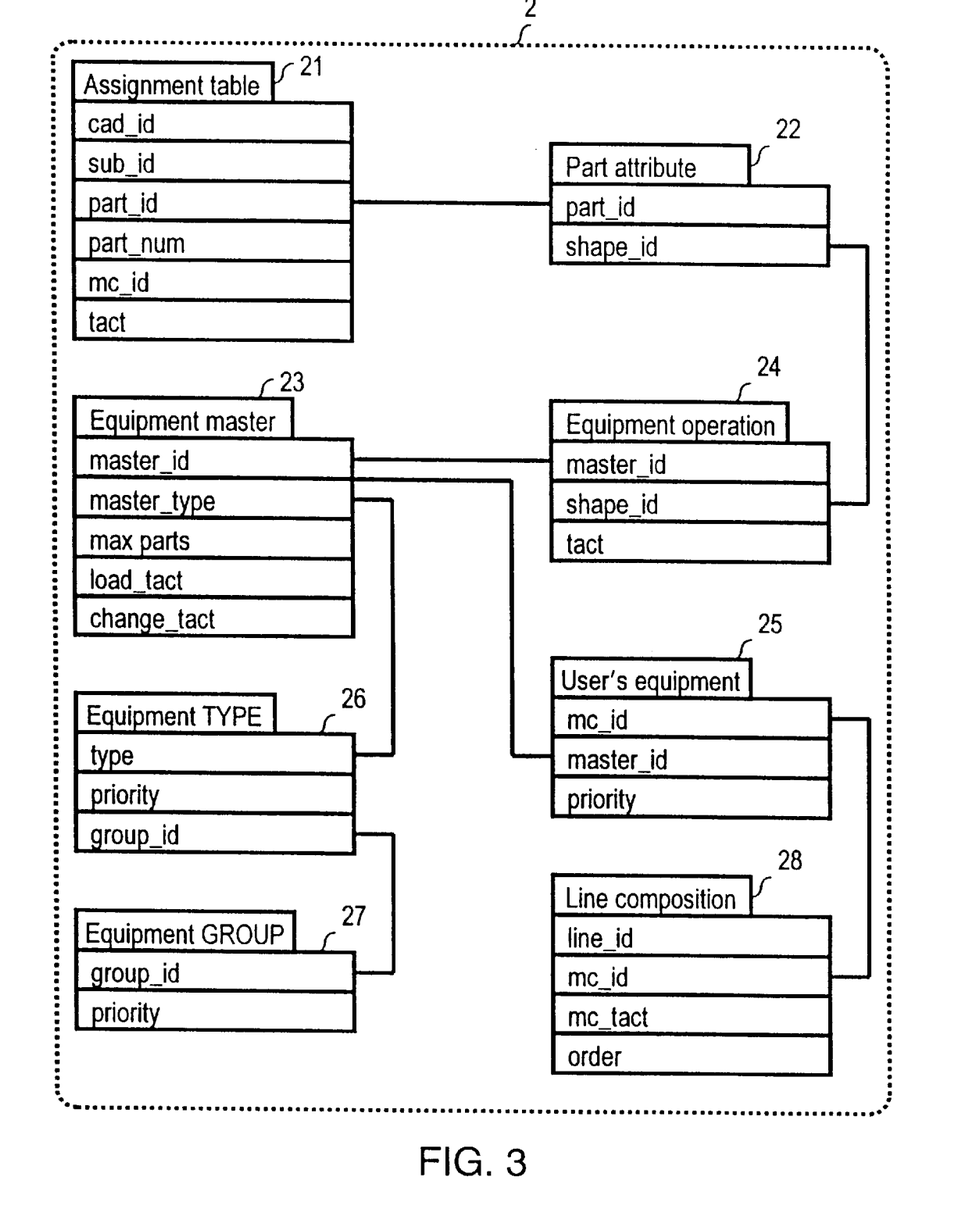
FIG. 3 depicts data tables flow of the control information used in an embodiment of the present invention.

There are eight tables, i.e. an assignment table 21, part attribute 22, equipment master 23, equipment operation 24, user's equipment 25, equipment TYPE 26, equipment GROUP 27, and line composition 28.

The attributes of a specific PCB are controlled with the assignment table numbers (cad_id) of the assignment table 21. The part assignment number(sub_id) on the part assignment table identifies the parts thereon, a part number(part_id) thereof identifies an electronic part thereon, a number of an electronic part(part-num) is a quantity of the part to be mounted onto the PCB. A machine number(mc_id) identifies a machine to which the parts are assigned. A part mounting tact(tact) is a tact time for mounting a part onto the PCB by the machine. The machine number and the part mounting tact time are set as computing results of the CPU. When a specific part must be assigned to a specific machine beforehand, a machine number can be assigned before a computing operation.

The part attribute 22 is linked with the assignment table 21 through the part number(part-id) to set the attribute of electronic parts. In this embodiment, a part shape number (shape-id) is used for specifying a part shape. Other data such as a size of a part, or species of parts including QFP (quad flat package) and SOP (small outline package) can be used for the part number.

The equipment operation 24 sets the part tact time of the part corresponding to the part shape number(master-id), which part is mounted onto the PCB by the equipment specified with the species number.

The equipment master 23 controls every aspect of the equipment. The species number(master-id) identifies a species of equipment, a type number groups features of equipment, a part loadable number(max parts) is a maximum loadable quantity of parts to a machine, and a loading tact time is a travel time for transferring a PCB. A tool change tact(change-tact) sets a time to be spent for changing chucks or nozzles transferring parts before mounting. This tool change tact time is used in general type machines such as a robot type. Other tact times proper to the machine can be supplemented to this table.

User's equipment 25 is to control the equipment which a user keeps in his factory. A machine number (mc_id) identifies a machine, and a species number(master-id) is linked to the species number of equipment controlled by the equipment master 23. The priority order of part assignment (priority) is applied to when assigning the same type of machines within a same line.

The equipment TYPE 26 controls the priority order of type numbers (master_type) on the equipment master 23. The type numbers of equipment are linked with the type numbers listed on the equipment master 23. An assignment priority order is a priority order of the equipment types. The equipment group number (group_id) is used when one type of PCB needs different lines.

Equipment GROUP 27 controls the equipment group of the equipment TYPE. The equipment group numbers are linked with the equipment group numbers of the equipment TYPE. An assignment priority order is a priority order of the equipment group.

A computing operation result is written into the line composition 28. A line number(lind_id) specifies the computing operation result, and a machine number is proper to machines composing a line. The machine number is linked with the machine number in the user's equipment 25. A machine tact (mc_tact) is a tact time of each machine comprising the line. A composition order (order) in an order of machines comprising the line.

A procedure for determining the line composition is now explained by referring to FIG. 4 through FIG. 7. In the Figs., Process 2 is processed in S1–S5, and Process 3 is processed in S6.

Figure 4:
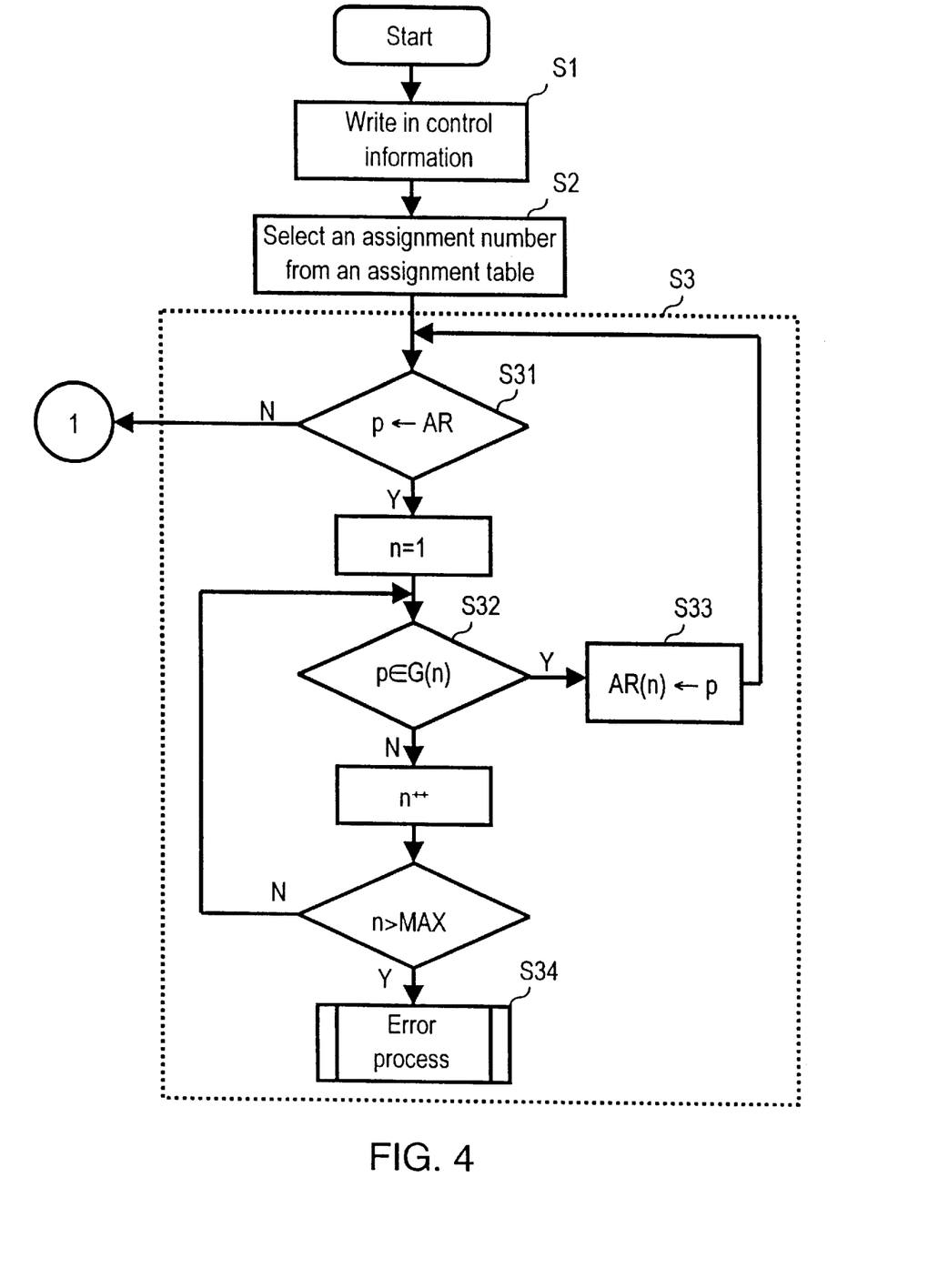
FIG. 4 is an information flow chart of determining a line composition used in an embodiment of the present invention.

FIG. 4 depicts this process: write the control information of process 1 (S1), and select a part assignment table No. corresponding to a PCB in order to identify the PCB (S2). Then assign the parts to each equipment group (S3).

The processing S3 is now detailed: take out any single electronic part=p from the part assignment table AR (S31), and assign the electronic part to the equipment group having the higher priority. The smaller "n" becomes the higher priority has the equipment group. When a machine which can load the electronic part is available among the machines belong to the equipment group (S32), assign the electronic part to the part assignment table AR(n) corresponding to the equipment group (S33). When the electronic part cannot be loaded into any machine of equipment group, execute an error process (S34) and then end the process.

Figure 5:
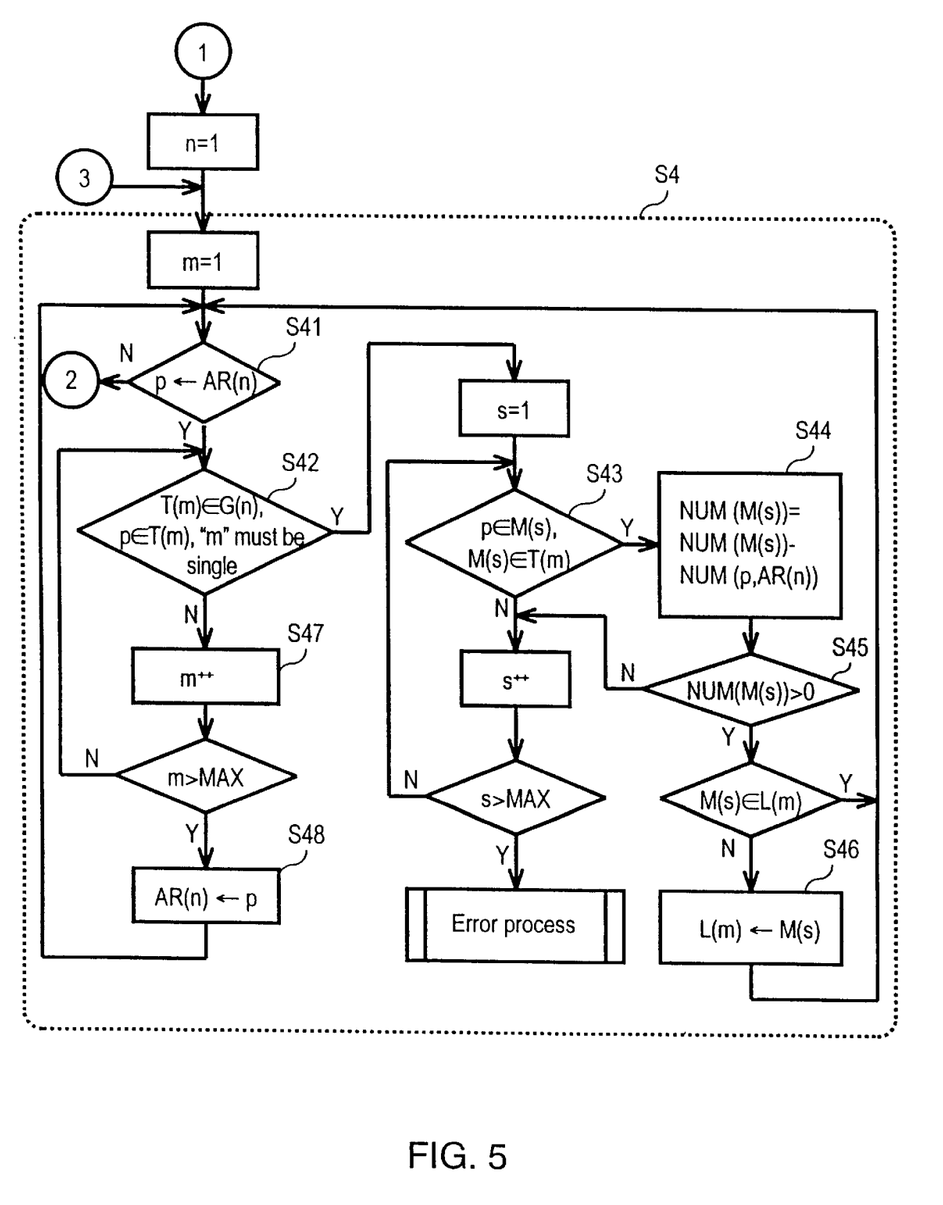
FIG. 5 is another information flow chart for determining a line composition used in an embodiment of the present invention.

FIG. 5 depicts this process: take out any single part from the part assignment table AR(n), and assign the part to loadable machines of equipment TYPE (m) which belongs to a proper equipment GROUP (n), then supplement the machines assigned with the part to a partial line L (m) proper to the equipment TYPE (S4).

Now the process in S4 is detailed: take out any single electronic part from the part assignment table AR(n) (S41), and judge the process in S4 whether the part can be loaded to any machine of the equipment TYPE T(m) which belongs to the equipment GROUP G(n) (S42). In this case, we assume that the part can be loaded to a machine belonging to only one specific equipment TYPE. The smaller "m" becomes, the higher priority order has the equipment TYPE. Select the machines satisfying the above condition based on the priority order, and assign the parts satisfying (S42) to the selected machines (S43). When a present loadable part quantity of the machine is greater than zero (S45): NUM (M(s))>0, supplement the machine to a partial line L(m) corresponding to the equipment TYPE T(m) (S46).

Change an equipment TYPE based on the priority order until all the parts satisfy the condition of (S42), and execute the same process (S47). If some part cannot meet any equipment TYPE, then return the part to the part assignment table (S48).

Process the remained parts on AR (n) (S5). The process of S5 is detailed by referring to FIG. 6.

Figure 6:
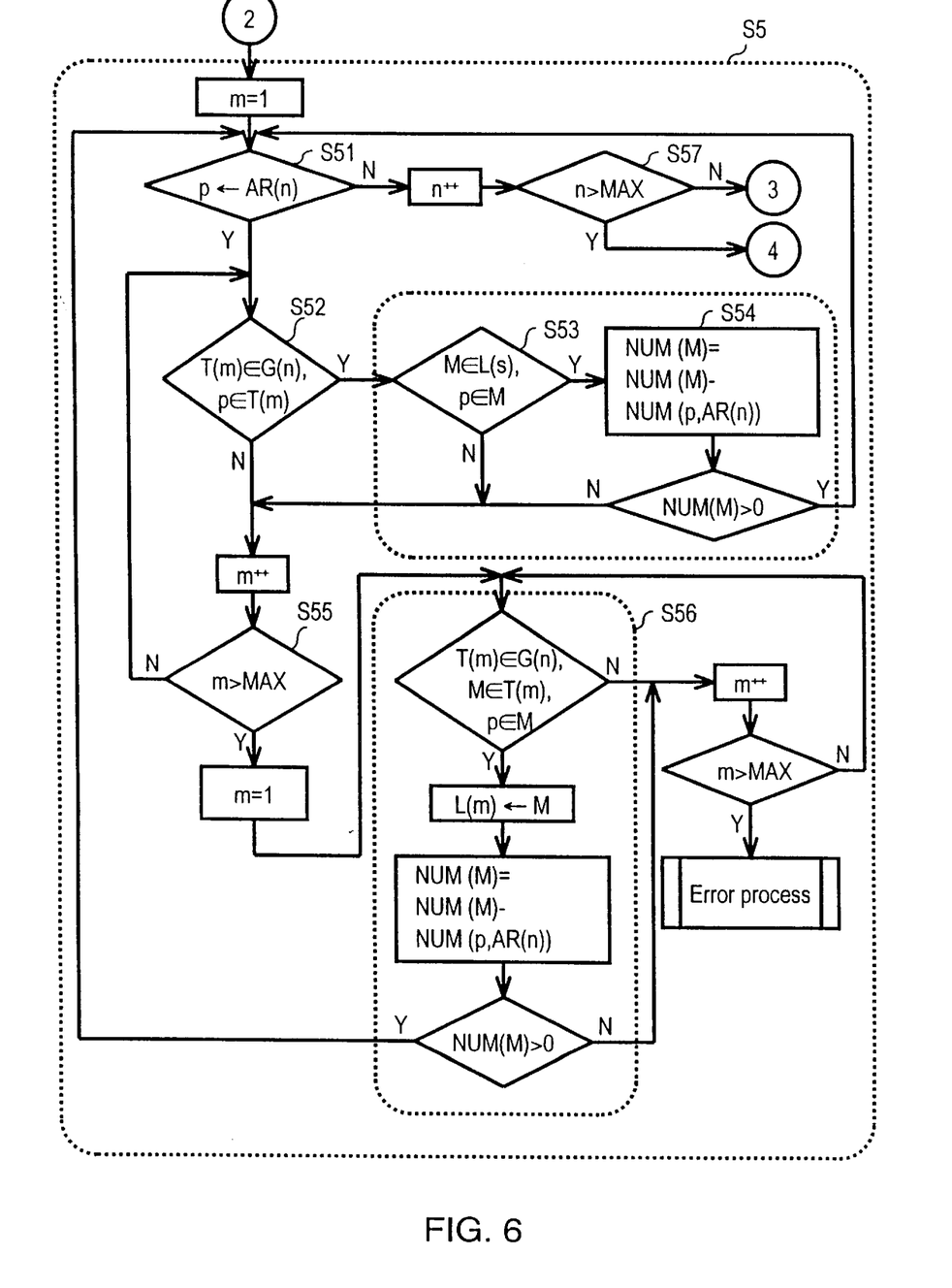
FIG. 6 is further information flow chart for determining a line composition used in an embodiment of the present invention.

Take out any single part from AR(n) (S51), and judge whether the part can be loaded to a machine of the equipment TYPE T(m) belonging to the equipment GROUP G(n) (S52). When a machine M satisfies the above condition and also belongs to the existing partial line L(m) (S53), and as an assignment results the present loadable part quantity is greater than zero (S54): NUM(M)>0. Assign the parts to the machine.

When the part does not satisfy the above condition of (S52) degrade the priority order one by one, and execute the same process. If some unassignable parts remain (S55), supplement a new machine to the partial line L(m) (S54).

After such a process, i.e. take out any single part from a part assignment table and assign it to a machine, is successively executed until all parts are assigned (S57), move on to Process 3.

Process 3

Figure 7:
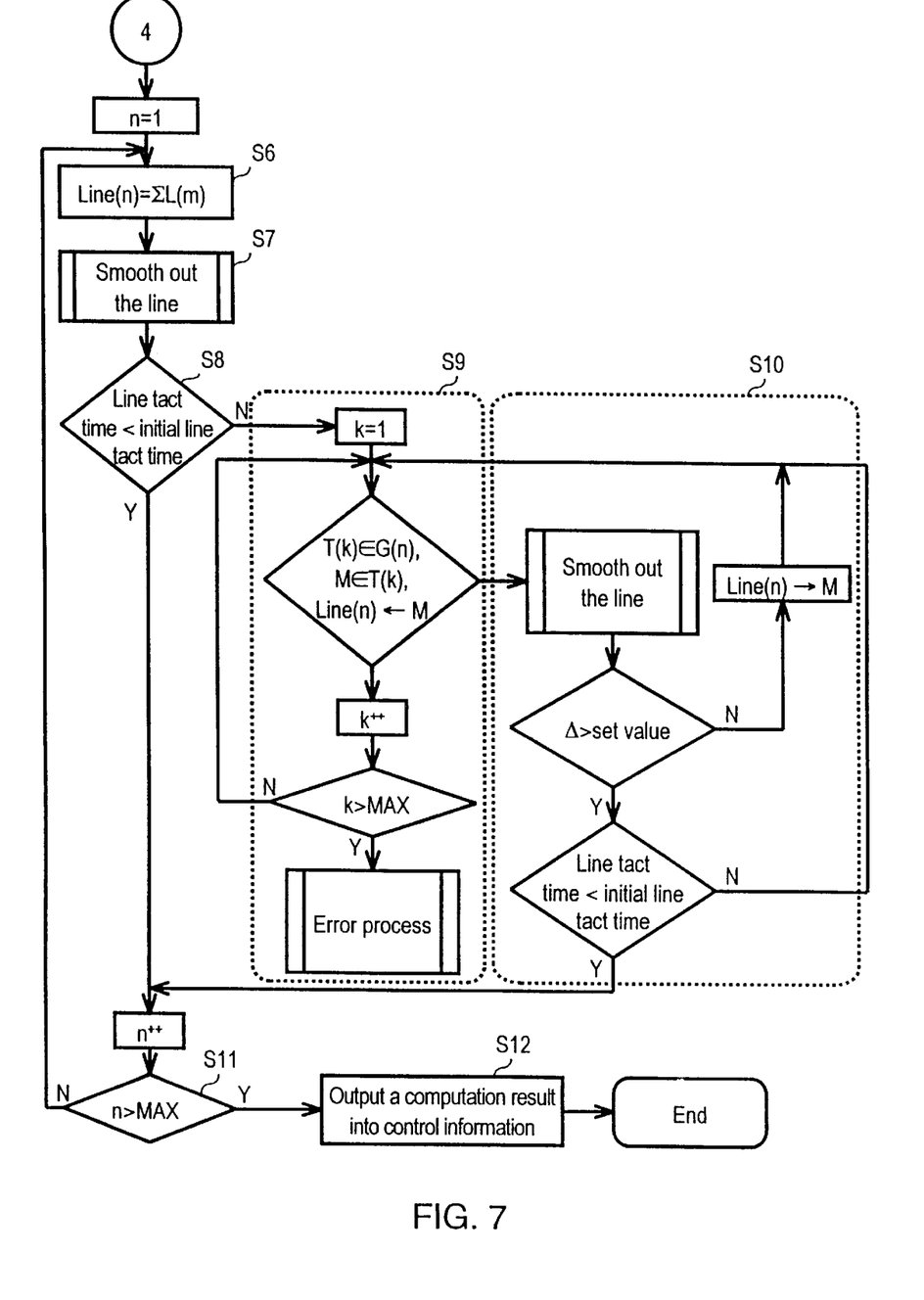
FIG. 7 is still further information flow chart for determining a line composition used in an embodiment of the present invention.

Process 3 is detailed by referring to FIG. 7. Integrate the partial lines set up type-wise in Process 2 into one of a line of the equipment GROUP G(n) (S6). Then, smooth out the line (S7) so that differences between tact times may be minimized. The total tact time of each machine is a sum of a loading tact time listed on the equipment master 23, tool change tact time, and part mounting tact time listed on the equipment operation 24×quantity. The tact time of a line is the longest tact time of the machines.

When a line tact time does not satisfy the initial line tact time (S8), supplement a new machine based on the priority order of equipment GROUP, equipment TYPE, and machine, in this order (S9).

Smooth out the supplemented line, and when a reduced rate of the line tact time is greater than the set value, S8 judgment is given, and when the reduced rate is less than the set value, remove the supplemented machine from the line (S10).

Execute the end process (S11) to each line, and store computing operation results into the control information (S12) in the external storage, and then end the entire process.

INDUSTRIAL APPLICABILITY

According to the present information, when producing a specific PCB by plural mounting equipment, a line composition of which tact time is less than the initial set tact time can be automatically determined. Thus the present invention can save a lot of time and labor which a conventional method by manual work requires.

In planning an annual business plan, a common line composition is needed for plural types of PCBs. For this case, the present invention can repeat calculations automatically for every type of PCBs until the tact times of all types of PCBs are satisfied.

The present invention enable any staff in the factory to find a line composition through inputting control information. Therefore, it is not any more necessary to rely on a skilled person about the mounting conditions of equipment for determining the line composition.

What is claimed is:

1. An equipment operation method which determines a line composition, in a plurality of groups of equipment which mount parts to an object to be processed, by selecting appropriate machines from said plurality of groups of equipment for processing designated products so that a tact time of an assembly line may not exceed an initial set tact time, said operation method comprising the steps of:

Step 1. grouping machines into said plurality of groups based on a priority order of assigning each part to machines considering the machines' features, and storing such information into an external storage as the priority orders between machines within each group, a priority order between the groups, a mounting tact time of each loadable part to a machine, and a tact time proper to each machine;

Step 2. calculating a tact time of each assembly line using the stored data after supplementing machines based on the priority order from said plurality of groups of equipment in the line composition until all necessary parts for processing the product are loaded to the machines;

Step 3. calculating the tact time of the line composition by supplementing machines based on the priority order from said plurality of groups of equipment to the line composition determined in Step 2 until the tact time of the assembly line becomes not more than the initial set tact time.

2. An equipment operation method which determines a line composition, in a plurality of groups of mounting equipment which mount electronic parts onto a printed circuit board (PCB), by selecting appropriate mounting machines from said plurality of groups of mounting equipment for mounting electronic parts to a designated printed circuit board (PCB) so that a tact time of an assembly line may not exceed an initial set tact time, said operation method comprising the following steps of:

Step 1. grouping the machines into said plurality of groups of mounting equipment based on a priority order of assigning each electronic part to mounting machines considering the machines' features, and storing such information into an external storage as the priority orders between machines within each group, a priority order between the groups, a mounting tact time of each loadable electronic part to a mounting machine, and tact time information proper to each mounting machine;

Step 2. calculating a tact time of each assembly line using the stored information after supplementing mounting machines based on the priority order from said plurality of groups of mounting equipment until all necessary electronic parts to be mounted on to the designated PCB are loaded to the mounting machines;

Step 3. calculating the tact time of the line composition by supplementing mounting machines based on the priority order from said plurality of groups of mounting equipment to the line composition determined in Step 2 until the tact time of the assembly line becomes not more than the initial set tact time.

* * * * *